United States Patent
Xie et al.

(10) Patent No.: US 12,119,223 B2
(45) Date of Patent: Oct. 15, 2024

(54) SINGLE PRECURSOR LOW-K FILM DEPOSITION AND UV CURE FOR ADVANCED TECHNOLOGY NODE

(71) Applicant: Applied Materials, Inc., Santa Clara, CA (US)

(72) Inventors: Bo Xie, San Jose, CA (US); Ruitong Xiong, Santa Clara, CA (US); Sure K. Ngo, Dublin, CA (US); Kang Sub Yim, Palo Alto, CA (US); Yijun Liu, Santa Clara, CA (US); Li-Qun Xia, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 288 days.

(21) Appl. No.: 17/624,009

(22) PCT Filed: Dec. 21, 2021

(86) PCT No.: PCT/US2021/064548
§ 371 (c)(1),
(2) Date: Dec. 30, 2021

(87) PCT Pub. No.: WO2022/140346
PCT Pub. Date: Jun. 30, 2022

(65) Prior Publication Data
US 2023/0142684 A1    May 11, 2023

Related U.S. Application Data

(60) Provisional application No. 63/130,824, filed on Dec. 27, 2020.

(51) Int. Cl.
*H01L 21/02* (2006.01)
*C23C 16/40* (2006.01)
(Continued)

(52) U.S. Cl.
CPC ...... *H01L 21/02348* (2013.01); *C23C 16/401* (2013.01); *C23C 16/505* (2013.01);
(Continued)

(58) Field of Classification Search
None
See application file for complete search history.

(56) References Cited

U.S. PATENT DOCUMENTS 7,019,386 B2    3/2006    Ghoshal et al.
7,288,292 B2    10/2007    Gates et al.
(Continued)

FOREIGN PATENT DOCUMENTS

KR    20090015160 A    2/2009
WO    2004090019 A1    10/2004

OTHER PUBLICATIONS

PCT International Search Report and Written Opinion in PCT/US2021/064548 dated Apr. 13, 2022, 13 pages.
(Continued)

*Primary Examiner* — Hsien Ming Lee
(74) *Attorney, Agent, or Firm* — Servilla Whitney LLC

(57) ABSTRACT

Method of forming low-k films with reduced dielectric constant, reduced CHx content, and increased hardness are described. A siloxane film is on a substrate surface using a siloxane precursor comprising O—Si—O bonds and cured using ultraviolet light.

20 Claims, 1 Drawing Sheet

(51) Int. Cl.
    *C23C 16/505*     (2006.01)
    *C23C 16/56*     (2006.01)

(52) U.S. Cl.
    CPC ........ *C23C 16/56* (2013.01); *H01L 21/02164* (2013.01); *H01L 21/02216* (2013.01); *H01L 21/02274* (2013.01)

(56) References Cited

U.S. PATENT DOCUMENTS

| | | |
|---|---|---|
| 7,611,757 B1 | 11/2009 | Bandyopadhyay et al. |
| 7,906,174 B1 | 3/2011 | Wu et al. |
| 8,101,236 B2 | 1/2012 | Edelstein et al. |
| 2005/0064726 A1 | 3/2005 | Reid et al. |
| 2008/0044668 A1 | 2/2008 | Dimitrakopoulos et al. |
| 2015/0249007 A1 | 9/2015 | Xiao et al. |
| 2015/0303056 A1 | 10/2015 | Vaadarajan et al. |
| 2016/0042943 A1* | 2/2016 | Ribaudo ........... H01J 37/32926 156/345.28 |
| 2017/0213726 A1 | 7/2017 | Saly et al. |

OTHER PUBLICATIONS

Zhang, Lei, et al., "Characterization of low-dielectric-constant SiCON films grown by PECVD under different RF power", 9th International Conference on Solid-State and Integrated Circuit Technology, 2008, 4.

* cited by examiner

SINGLE PRECURSOR LOW-K FILM DEPOSITION AND UV CURE FOR ADVANCED TECHNOLOGY NODE

CROSS-REFERENCE TO RELATED APPLICATIONS

This application is the National Stage entry of PCT/US2021/064548, filed on Dec. 21, 2021, which claims priority to United States Provisional Application. Ser. No. 63/130,824, filed Dec. 27, 2020, the entire disclosures of which are hereby incorporated by reference herein.

TECHNICAL FIELD

Embodiments of the present disclosure pertain to methods of depositing silicon-oxide films. More particularly, embodiments of the disclosure provide methods of depositing single-precursor silicon-oxide films with post deposition ultraviolet (UV) curing during the manufacture of electronic devices, and in particular, integrated circuits (ICs).

BACKGROUND

Integrated circuits have evolved into complex devices that can include millions of transistors, capacitors, and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced, it is necessary to use low resistivity conductive materials as well as low dielectric constant insulating materials to obtain suitable electrical performance from such components.

Deposition of films on a substrate surface is an important process in a variety of industries including semiconductor processing, semiconductor manufacturing equipment, diffusion barrier coatings, and dielectrics for magnetic read/write heads. In the semiconductor industry, as an example, miniaturization requires atomic level control of film deposition to produce uniform coatings on high aspect structures.

Atomic Layer Deposition (ALD) and Plasma-Enhanced ALD (PEALD) are deposition techniques that offer control of film thickness and uniformity. Most ALD processes are based on binary reaction sequences, where each of the two surface reactions occurs sequentially. Because the surface reactions are sequential, the two gas phase reactants are not in contact, and possible gas phase reactions that may form and deposit particles are limited. Due to continuously decreasing device dimensions in the semiconductor industry, there is increasing interest in and applications that use ALD/PEALD.

Low-k silicon-based dielectric films are important for the microelectronics manufacturing. Historically, silicon-based low-k films have been deposited by ALD in a furnace chamber. To achieve the desired film properties, the film needs to be deposited at temperatures above 500° C. With thermal budgets continually decreasing with every chip node, there is a need for the deposition of low-k films at temperatures below 500° C. Multiple precursors require multiple steps to achieve physical properties required for semiconductor manufacture but in turn, introduce the risk of damaging advanced nodes with every additional step.

Therefore, there is a need for single-precursor PECVD processes that produce low-k films that have improved mechanical properties without damaging BEOL structures during deposition and curing of these films.

SUMMARY

One or more embodiments of the disclosure are directed to methods of forming a low-k film. A siloxane film is deposited on a substrate surface by exposing the substrate surface to a siloxane precursor comprising O—Si—O bonds. The siloxane film has an initial CHx content and an initial dielectric constant. The siloxane film is cured by exposing the siloxane film to ultraviolet light to form a low-k film. The low-k film has a cured CHx content and cured silicon cage to silicon network ratio, the cured CHx content lower than the initial CHx content.

Additional embodiments of the disclosure are directed to methods of forming a low-k film. A siloxane film is deposited on a substrate surface by exposing the substrate surface to a siloxane precursor comprising O—Si—O bonds with a high frequency RF plasma with a power in the range of 50 to 1000 W at a temperature in the range of 200° C. to 350° C. The siloxane film has an initial CHx content greater than 4.5%, a hardness less than 2 GPa and an initial dielectric constant greater than 3.5. The siloxane film is cured by exposing the siloxane film to ultraviolet light in an inert environment comprising helium and argon at a pressure in the range of 3 to 100 Torr, at a temperature in the range of 150° C. to 400° C. for a time in the range of 1 to 10 minutes to form a low-k film, the low-k film having a cured CHx content and cured silicon cage to silicon network ratio, the cured CHx content lower than the initial CHx content.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, gallium nitride, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. As an example where a film/layer or partial film/layer has been deposited onto a substrate surface, the exposed surface of the newly deposited film/layer becomes the substrate surface.

As used in this specification and the appended claims, the terms "precursor," "reactant," "reactive gas," and the like are used interchangeably to refer to any gaseous species that can react with the substrate surface.

Embodiments of the disclosure provide alternative methods to current industry standards for forming low-k film. Single precursor deposition of a siloxane film have been surprisingly found to achieve similar k values to those of two-precursor deposition films, but with higher mechanical strength than those of films formed with two precursors.

One or more embodiments of the disclosure advantageously provide organosiloxane precursors for depositing films on small device size/features of back end of line (BEOL) advanced technology nodes. Some embodiments advantageously provide films with a k of less than 3.5 and improved mechanical strength after UV curing.

Some embodiments enable safer, more efficient, and more cost-effective depositions of SiCO films and UV curing the films to reduce CHx content and dissociate organic species. This reduction of CHx content and organic species introduces porosity and improves mechanical properties of the film while maintaining low-K of the film and without damaging the BEOL structures.

Figure 1:
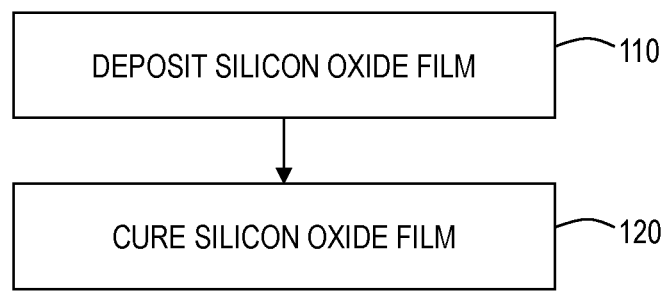
FIG. 1 illustrates a method of forming a low-k film according to one or more embodiment of the disclosure.
Figure 2:
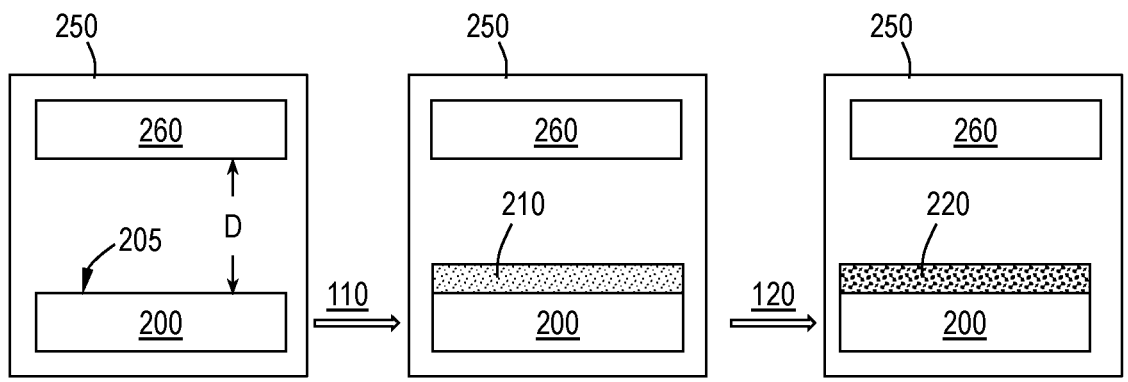
FIG. 2 illustrates a cross-sectional schematic view of a substrate during formation of a low-k film according to one or more embodiment of the disclosure.

Referring to FIGS. 1 and 2, one or more embodiments of the disclosure provide methods 100 for forming low-k films on substrates 200. A substrate 200 having a substrate surface 205 is positioned within a processing chamber 250 and spaced a distance D from a showerhead 260.

At process 110, a siloxane film 210 is deposited on the substrate surface 205 by exposing the substrate surface 205 to a siloxane precursor. The siloxane precursor comprises O—Si—O bonds and is able to deposit onto the substrate surface 205 under the deposition conditions employed. In some embodiments, the siloxane precursor is able to deposit a film under chemical vapor deposition (CVD) conditions with or without a co-reactant. In some embodiments, the siloxane precursor thermally decomposes on the substrate surface 205. In some embodiments, the siloxane precursor comprises one O—Si—O moiety. In some embodiments, the siloxane precursor comprises two or more O—Si—O moieties.

Suitable CVD deposition precursors include, but are not limited to, siloxanes of the general formula $Si_{(x)}O_{(x-1)}R^1R^2R^3$ where each R is independently selected from hydrogen, an alkyl ester group, and alkyl group, an aryl ester group, an aryl group, a vinyl, an acyl ester group, an acyl group, or combinations and/or combinations thereof. Examples of suitable precursors include, but are not limited to, methyldiethoxysilane (I), dimethyltetramethoxydisiloxane (II), dimethyldimethoxysilane (III), octamethylcyclotetrasiloxane (IV), and vinylmethyldimethoxysilane (V).

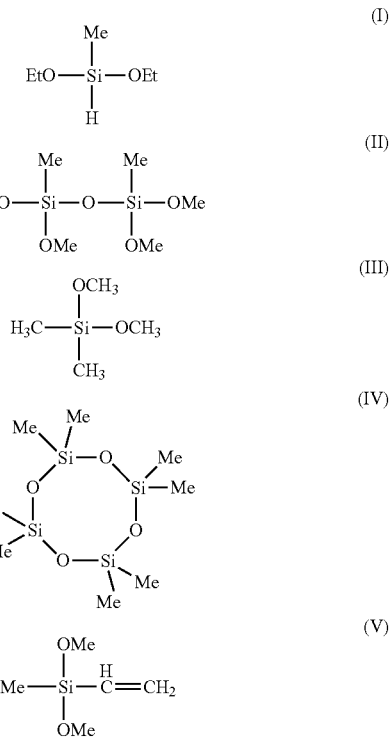

In some embodiments, the siloxane film 210 is deposited at a temperature in the range of 100° C. to 450° C. In some embodiments, the siloxane film 210 is deposited at a temperature in the range of 150° C. to 400° C., or 200° C. to 350° C., or 250° C. to 300° C.

In some embodiments, the siloxane film is deposited at a pressure in the range of 0.5 to 500 Torr, or in the range of 1 to 400 Torr, or in the range of 10 to 300 Torr, or in the range of 50 to 200 Torr.

In some embodiments, the siloxane film 210 is deposited using a high frequency RF plasma (HFRF). As used in this manner, the term "high frequency" means greater than or equal to 13.56 MHz. In some embodiments, the HFRF plasma has a power in the range of 50 W to 1000 W, or in the range of 100 W to 750 W, or in the range of 200 W to 500 W.

During deposition of the siloxane film 210, the substrate surface 205 is positioned a distance from the showerhead 260 in the processing chamber 250. In some embodiments, the substrate surface 205 is spaced from the showerhead 260 by an amount in the range of 200 to 1000 mils.

The siloxane film 210 has an initial CHx content, an initial dielectric constant (k), initial silicon cage to silicon network ratio and an initial hardness. The initial CHx content of some embodiments is greater than 4.5, based on FTIR peaks. In some embodiments, the initial CHx content is greater than or equal to 5%, 5.5%, 6%, 6.5%, 7%, 7.5%, 8%, 8.5%, 9%, 9.5% or 10%. The initial dielectric constant of the siloxane film is greater than 3.5. In some embodiments, the initial dielectric constant of the siloxane film 210 is greater than or equal to 3.55, 3.6, 3.65, 3.7, 3.75, 3.8, 3.85 or 3.9. The initial hardness of the siloxane film 210 is less than or equal to 2 GPa, 1.9 GPa, 1.8 GPa, 1.7 GPa, 1.6 GPa or 1.5 GPa.

In some embodiments, the siloxane precursor is flowed in a carrier gas. The carrier gas can be any suitable gas that is not reactive with the siloxane precursor. In some embodiments, oxygen (O₂) is coflowed with the carrier gas during deposition of the siloxane film 210. The carrier gas of some embodiments is flowed at a rate in the range of 50 to 5000 sccm. The oxygen gas of some embodiments is flowed at a rate in the range of >0 to 500 sccm. In some embodiments, there is no oxygen gas flowed with the carrier gas.

Using a broadband UV source, organic species can be effectively dissociated and introduce porosity while acting on the Si—O—Si network of the deposited film to improve mechanical properties while maintaining a low-k value. At process 120, the siloxane film 210 is cured to form a low-k film 220. Curing of the siloxane film 110 comprises exposing the siloxane film 110 to ultraviolet (UV) light to form a low-k film 120. The cured siloxane film or low-k film 220 has a cured CHx content, a cured silicon cage to silicon network content, a cured dielectric constant and a cured hardness.

In some embodiments, the siloxane film 210 is cured by UV light at a temperature in the range of 75° C. to 500° C., or 100° C. to 450° C., or 150° C. to 400° C., or 200° C. to 350° C. In some embodiments, the siloxane film 210 is exposed to UV light for a time in the range of 1 to 10 minutes, or 2 to 9 minutes.

In some embodiments, the siloxane film 210 is cured in an inert environment. In some embodiments, the inert environment is at a pressure in the range of 3 to 100 Torr, or 5 to 95 Torr, or 10 to 90 Torr, or 15 to 85 Torr, or greater than 5 Torr, 10 Torr, 15 Torr or 20 Torr. In some embodiments, the inert environment comprises helium (He) and argon (Ar) gases. The helium gas of some embodiments is flowed at a rate in the range of 1000 to 20000 sccm. The argon gas of some embodiments is flowed at a rate in the range of 1000 to 20000 sccm.

After curing, the low-k film of some embodiments has a cured CHx content in the range of 1.25 to 4.5%, or 1.5 to 4.25% or 1.75 to 4.2%, or 2 to 3.9% or 2.2 to 3.8%. In some embodiments, the cured CHx content is less than 4.5%, 4%, 3.5%, 3% or 2.5%. The cured CHx content is lower than the initial CHx content by greater than or equal to 0.25%, 0.5%, 0.75% of 1% absolute.

In some embodiments, the low-k film 220 has a dielectric constant in the range of 2.3 to 3.5, or 2.5 to 3.0, or 3.0 to 3.2, or 2.3 to 2.8, or in the range of 2.4 to 2.8, or 2.5 to 2.7 or 2.5 to 2.65. In some embodiments, the low-k film 220 has a cured dielectric constant less than 2.8, 2.75, 2.7, 2.65, 2.6, 2.55 or 2.5. In some embodiments, the cured dielectric constant is lower than the initial dielectric constant by greater than or equal to 0.2, 0.3, 0.4, 0.5, 0.6, 0.7 or 0.8.

In some embodiments, the low-k film has a cured hardness in the range of 1.0 to 2.5, or 1.5 to 2.0, or 2.0 to 7.5 GPa, or 2.5 to 7 GPa, or 3 to 6.5 GPa, or greater than 2.0 GPa, 2.5 GPa, 3 GPa or 3.5 GPa. In some embodiments, the cured hardness is greater than the initial hardness by an amount greater than or equal to 0.5 GPa, 1 GPa, 1.5 GPa or 2 GPa.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a low-k film, the method comprising:
    depositing a siloxane film on a substrate surface by exposing the substrate surface to a siloxane precursor comprising O—Si—O bonds, the siloxane film having an initial CH content and an initial dielectric constant; and
    curing the siloxane film by exposing the siloxane film to ultraviolet light to form a low-k film, the low-k film having a cured CH content and cured silicon cage to silicon network ratio, the cured CH content lower than the initial CH content.

2. The method of claim 1, wherein the siloxane film is deposited at a temperature in the range of 100° C. to 450° C.

3. The method of claim 1, wherein the siloxane film is deposited at a pressure in the range of 0.5 to 500 Torr.

4. The method of claim 1, wherein the substrate surface is spaced from a showerhead by an amount in the range of 200 to 1000 mils.

5. The method of claim 1, wherein the siloxane film is deposited using an RF plasma with a frequency greater than or equal to 13.56 MHz and a power in the range of 50 to 1000 W.

6. The method of claim 1, wherein curing the siloxane film occurs at a temperature in the range of 75 to 500° C.

7. The method of claim 1, wherein the siloxane film is exposed to the ultraviolet light for a time in the range of 1 to 10 min.

8. The method of claim 1, wherein the siloxane film is cured in an inert environment at a pressure in the range of 3 to 100 Torr.

9. The method of claim 8, wherein the inert environment comprises helium and argon.

10. The method of claim 9, wherein the helium is flowed at a rate in the range of 1000 to 20000 sccm.

11. The method of claim 9, wherein the argon is flowed at a rate in the range of 1000 to 20000 sccm.

12. The method of claim 1, wherein the initial CH content is greater than 4.5%.

13. The method of claim 12, wherein the cured CH content is in the range of 1.25 to 4.5%.

14. The method of claim 1, wherein the initial dielectric constant is greater than 3.5.

15. The method of claim 14, wherein the low-k film has a dielectric constant in the range of 2.8 to 3.5.

16. The method of claim 1, wherein the siloxane film has a hardness less than 2 GPa.

17. The method of claim 16, wherein the low-k film has a hardness in the range of 2.0 to 7.5 GPa.

18. The method of claim 1, wherein the siloxane precursor comprises one or more of

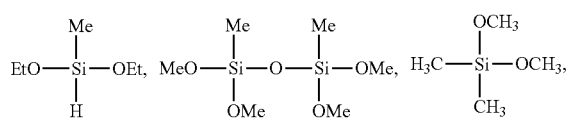
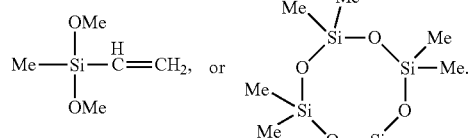

19. A method of forming a low-k film, the method comprising:
depositing a siloxane film on a substrate surface by exposing the substrate surface to a siloxane precursor comprising O—Si—O bonds with an RF plasma with a frequency greater than or equal to 13.56 MHz and a power in the range of 50 to 1000 W at a temperature in the range of 200° C. to 350° C., the siloxane film having an initial CH content greater than 4.5%, a hardness less than 2 GPa and an initial dielectric constant greater than 3.5; and
curing the siloxane film by exposing the siloxane film to ultraviolet light in an inert environment comprising helium and argon at a pressure in the range of 3 to 100 Torr, at a temperature in the range of 150° C. to 400° C. for a time in the range of 1 to 10 minutes to form a low-k film, the low-k film having a cured CH content and cured silicon cage to silicon network ratio, the cured CH content lower than the initial CH content.

20. The method of claim 19, wherein the low-k film has a cured CH content in the range of 1.25 to 4.5%, a dielectric constant in the range of 2.8 to 3.5, a hardness in the range of 2.0 to 7.5 GPa.

* * * * *